(12) United States Patent
Uemura et al.

(10) Patent No.: US 8,138,506 B2
(45) Date of Patent: Mar. 20, 2012

(54) GROUP III NITRIDE-BASED COMPOUND SEMICONDUCTOR LIGHT-EMITTING DEVICE

(75) Inventors: Toshiya Uemura, Kiyosu (JP); Naoki Arazoe, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 270 days.

(21) Appl. No.: 12/654,350

(22) Filed: Dec. 17, 2009

(65) Prior Publication Data

US 2010/0163894 A1 Jul. 1, 2010

(30) Foreign Application Priority Data

Dec. 26, 2008 (JP) ................................. 2008-334320
Sep. 29, 2009 (JP) ................................. 2009-224166

(51) Int. Cl.
*H01L 27/15* (2006.01)
*H01L 31/12* (2006.01)
*H01L 33/00* (2010.01)

(52) U.S. Cl. .................... 257/79; 257/94; 257/E33.001; 257/E31.127

(58) Field of Classification Search ............... 257/79, 257/85, 94, 96, 103, E33.001, E31.127
See application file for complete search history.

(56) References Cited

U.S. PATENT DOCUMENTS 7,863,630 B2 * 1/2011 Takeuchi et al. ................ 257/88

FOREIGN PATENT DOCUMENTS

JP 2007-158128 A 6/2007

* cited by examiner

*Primary Examiner* — Hoai V Pham
(74) *Attorney, Agent, or Firm* — McGinn IP Law Group, PLLC

(57) ABSTRACT

In the Group III nitride-based compound semiconductor light-emitting device of the invention, an non-light-emitting area is formed in a light-emitting layer. In a light-emitting diode where light is extracted on the side of an n-layer, an outer wiring trace portion and an inner wiring trace portion of an n-contact electrode impedes light emission from the light-emitting layer. Therefore, there are provided, at the interface between a p-layer and a p-contact electrode, high-resistance faces having a width wider than the orthogonal projections of contact areas between the outer and inner wiring trace portions and the n-layer on the interface between the p-contact electrode and the p-layer. Through this configuration, current flow is limited, and portions having a total area equivalent to that of the high-resistance faces of the light-emitting layer serve as non-light-emitting areas. Thus, current can be supplied preferentially to an area of the light-emitting area where the outer wiring trace portion and the inner wiring trace portion are difficult to shade light, whereby light extraction efficiency with respect to supplied current can be enhanced.

23 Claims, 8 Drawing Sheets

$t/2 \leqq d \leqq 5t$ $t/2 \leqq d \leqq dp \leqq 5t$
$wf \leqq wp \leqq 2wf$

US 8,138,506 B2

GROUP III NITRIDE-BASED COMPOUND SEMICONDUCTOR LIGHT-EMITTING DEVICE

BACKGROUND OF THE INVENTION

1. Field of the Invention

The present invention relates to a Group III nitride-based compound semiconductor light-emitting device, and more particularly, to a Group III nitride-based compound semiconductor light-emitting device conductive in which a p-layer is joined to a conductive support substrate via a layer made of conductive material, and an n-layer is disposed on a light extraction side.

The present invention is applicable to a light-emitting device produced through a so-called laser lift-off technique; i.e., a light-emitting device produced through epitaxially growing, on a hetero-substrate, a Group III nitride-based compound semiconductor, to thereby form a light-emitting device structure; bonding a conductive support substrate to the structure via a conductive layer made of metal, solder, or the like; and separating the hetero-substrate by irradiating, with laser light, the Group III nitride-based compound semiconductor thin layer present in the vicinity of the interface between the semiconductor and the hetero-substrate. The Group III nitride-based compound semiconductor light-emitting device of the present invention has an n-layer and a p-layer sandwiching pn junction or an active layer.

2. Background Art

The present inventors previously disclosed, in Japanese Patent Application Laid-Open (kokai) No. 2007-158128, a method for producing Group III nitride-based compound semiconductor light-emitting device through a so-called laser lift-off technique. A general feature of the disclosed Group III nitride-based compound semiconductor light-emitting device resides in that a p-layer is joined to a conductive support substrate via a layer made of conductive material, and an n-layer is disposed on the light extraction side. Generally, the electrode to be formed on the light extraction side (n-layer side) is not a transparent electrode but is formed from a metal or alloy providing ohmic contact. In the device, since the n-contact electrode formed on the n-layer impedes light extraction, the electrode must be formed into, for example, a line shape, and current is supplied to the entirety of the light-emitting area as uniformly as possible.

In a Group III nitride-based compound semiconductor light-emitting device produced through a laser lift-off process and having an n-layer side serving as a light extraction side, a large contact area between a p-layer and a p-contact electrode can be realized, and the material of the p-contact electrode can be selected mainly from the viewpoints of reflection characteristics and contact resistance. Therefore, as compared with Group III nitride-based compound semiconductor light-emitting devices of other structures, the light-emitting device produced through a laser lift-off process is useful for a large-scale (e.g., 1 mm×1 mm) planar device operating with large current. However, since the n-contact electrode formed on the light extraction side impedes light extraction, the design of the n-contact electrode leaves room for further improvement.

SUMMARY OF THE INVENTION

In view of the foregoing, an object of the present invention is to prevent, in a Group III nitride-based compound semiconductor light-emitting device produced through a laser lift-off process and having an n-layer side serving as a light extraction side, from lowering an output efficiency of light on account of shield by the n-contact electrode.

A main characteristic feature of the present invention resides in that current flow area from a p-contact electrode to a p-layer is limited and the current flow is concentrated in a part of a light-emitting layer to form a non-light-emitting area in which current is not flowed right under an n-contact electrode, in consideration that an n-contact electrode impedes light extraction. The current-flow-restricted area is provided such that the area is larger than the orthogonal projection of at least a bonding pad of the n-contact electrode on the interface between the p-contact electrode and the p-layer.

Accordingly, in a first aspect of the present invention, there is provided a Group III nitride-based compound semiconductor light-emitting device having an epitaxial layer joined on its p-layer side to a conductive support substrate via a layer formed of a conductive material, an n-layer disposed on a light extraction side, an n-contact electrode formed on the n-layer, and a p-contact electrode formed on the p-layer, wherein:

the n-contact electrode comprises a large-area portion serving as a bonding pad, and a wiring trace portion extending from the large-area portion;

the interface between the p-contact electrode and the p-layer includes a low-resistance face having low contact resistance with the p-contact electrode, and a high-resistance face having high contact resistance with the p-contact electrode; and the orthogonal projection of the large area potion of the n-contact electrode on the interface between the p-layer and the p-contact electrode does not fall in the low-resistance face.

The low-resistance face and the high-resistance face are formed through surface modification of the p-layer. For example, the low-resistance face is a surface of the p-layer obtained through a customary process, and the high-resistance face is a face obtained by a particular process such as plasma treatment or ion implantation.

The bonding pad is a large conductive area having an exposed outer surface on which an outer wiring is connected. Connection of the outer wiring to the bonding pad is performed through generally employed wire bonding. Alternatively, a solder or another conductive material may be used. On a large-area portion of the n-contact electrode formed in the bonding pad, a layer made of another conductive material may be stacked. The large-area portion of the n-contact electrode of the present invention also encompasses such a stacked structure.

The n-contact electrode of the present invention including a wiring trace portion is not necessarily made of a single material. The n-contact electrode of the present invention having a large-area portion and a wiring trace portion encompasses an n-contact electrode having a multi-layer structure formed from a high-ohmic conductive material and a conductive material other than the high-ohmic conductive material.

In a second aspect of the invention, the orthogonal projection of the large area potion of the n-contact electrode on the interface between the p-layer and the p-contact electrode has a contour which is separate from the contour of the low-resistance face by a distance falling within a range of t/2 to 5t, wherein t represents the average thickness of the n-layer.

In a third aspect of the invention, the orthogonal projection of the wiring trace portion of the n-contact electrode on the interface between the p-layer and the p-contact electrode does not fall in the low-resistance face.

In a fourth aspect of the invention, the orthogonal projection of the wiring trace potion of the n-contact electrode on the interface between the p-layer and the p-contact electrode has a contour which is separate from the contour of the low-resistance face by a distance falling within a range of t/2 to 5t, wherein t represents the average thickness of the n-layer.

In a fifth aspect of the invention, the wiring trace portion of the n-contact electrode has a closed circular outer wiring trace portion, and the orthogonal projection of the outer wiring trace portion on the interface between the p-layer and the p-contact electrode does not fall in the low-resistance face.

In a sixth aspect of the invention, the orthogonal projection of the outer wiring trace portion of the n-contact electrode on the interface between the p-layer and the p-contact electrode has a contour which is separate from the contour of the low-resistance face by a distance falling within a range of t/2 to 5t, wherein t represents the average thickness of the n-layer.

The fifth and sixth aspects differ from the third and fourth aspects in that a portion of the orthogonal projection of the wiring trace portion of the n-contact electrode on the interface between the p-layer and the p-contact electrode may be absent within the high-resistance face and at least the outer wiring trace is within the high-resistance face.

Another characteristic feature of the present invention will be described. Among the portions of the n-contact electrode, the large area for connecting to the outer wiring impedes light extraction. Therefore, the entire area of the n-layer just under the large area is controlled so as to not serve as a current flow area, and light emission from the area just under the interfering n-contact electrode is suppressed, whereby the portion of the supplied current which contributes to emission of light that can be extracted to the outside is increased. Yet another characteristic feature of the present invention will be described. The planar shape of the n-contact electrode, interfering with light extraction, is specifically designed so as to supply current uniformly in an area of the light-emitting layer which is to serve as an actual light-emitting area, whereby light is emitted uniformly in the light-emitting area.

In a seventh aspect of the invention, the n-layer has a quadrilateral plane shape, as viewed from the light extraction side, and has two large-area portions of the n-contact electrode provided thereon near two opposite angles of the quadrilateral shape, wherein at least a part of said two large-area portions facing the n-layer is not in ohmic contact with the n-layer.

In an eighth aspect of the invention, the part of said two large-area portions which is not in ohmic contact with the n-layer is an area of the large-area portions under which an insulating film is formed, the insulating film intervening between said two large-area portions and the n-layer.

In a ninth aspect of the invention, the insulating film is integrated with a protective film covering the outer side surfaces of the n-layer and the p-layer.

In a tenth aspect of the invention, the wiring trace portion of the n-contact electrode has a quadrilateral-frame-shape outer wiring trace portion, and the outer wiring trace portion is connected, at two quadrilateral corners thereof, to said two large-area portions.

In an eleventh aspect of the invention, the wiring trace portion of the n-contact electrode has an inner wiring trace portion which is formed so as to divide the surface of the n-layer surrounded by the outer wiring trace portion.

In a twelfth aspect of the invention, in the wiring trace portion of the n-contact electrode, the inner wiring trace portion has a width smaller than that of the outer wiring trace portion.

In a thirteenth aspect of the invention, when segments of the wiring trace portion of the n-contact electrode are disposed so as to satisfy the relationship $10 \leq L/t \leq 80$, wherein L denotes the distance between any two adjacent parallel segments of wiring trace, and t denotes the thickness of the n-layer.

In a fourteenth aspect of the invention, the part of the large-area portion which is in ohmic contact with the n-layer is in the form of a belt or a bent belt having a specific width, wherein the width is equal to or more and twice or less the width of the outer wiring trace portion of the n-contact electrode.

In a fifteenth aspect of the invention, the quadrilateral shape of the outer wiring trace portion is a parallelogram, rhombus, rectangle, or square.

In a sixteenth aspect of the invention, the plane shape of the n-contact electrode is point-symmetric with respect to the centroid of the plane shape of the n-layer, or line-symmetric with respect to a line segment connecting two corners of the quadrilateral n-layer where two large-area portions are not provided.

In a seventeenth aspect of the invention, the layer formed of a conductive material provided between the conductive support substrate and the p-layer includes at least one solder layer. The term "solder" refers to an alloy which has an eutectic temperature of about 400° C. or lower and which melts or exhibits fluidity at the eutectic temperature or higher.

In an eighteenth aspect of the invention, the light-emitting device is produced by forming at least an n-layer on an epitaxial growth substrate made of a hetero substrate, subsequently forming a p-layer, joining the p-layer to a conductive support substrate via at least a solder layer, and removing the epitaxial growth substrate through a laser lift-off process. The term "hetero substrate" refers to a substrate made of a material different from a Group III nitride-based compound semiconductor forming the epitaxial layer. For example, a sapphire substrate is included in the concept of hetero substrate.

In a nineteenth aspect of the invention, the outer side surfaces of the n-layer and the p-layer assume the form of inclined planes tapered forward from the n-layer side serving as an light extraction side to the p-layer side. The term "plane tapered forward" refers to a plane serving as the side plane of a truncated conoid, having a narrower upper horizontal cross-section and a wider lower horizontal cross-section.

In a twentieth aspect of the invention, the transparent dielectric layer is formed on at least a part of the exposed surface of the n-layer. In the present invention, the insulating film of the eighth aspect and the protective film of the ninth aspect are not necessarily transparent.

In a twenty-first aspect of the invention, the transparent dielectric layer is formed so as to cover the outer side surface of the device. In the present invention, when a protective film covering the outer side surface of the device as employed in the ninth aspect is additionally formed, the transparent dielectric layer is construed as being formed on the protective film.

In a twenty-second aspect of the invention, the transparent dielectric layer is formed so as not to come into contact with the n-contact electrode. Specifically, this means that, on an area of the n-layer surface between the n-contact electrode and the transparent dielectric layer, there is an exposed area of the n-layer where neither an n-contact electrode nor a transparent dielectric layer is formed.

In a twenty-third aspect of the invention, the orthogonal projection of the transparent dielectric layer on the interface between the p-contact electrode and the p-layer completely covers a whole area of the low-resistance face.

In light-emitting devices, a bonding pad for connection to an external member is an essential member. However, when a bonding pad electrode formed from a non-transparent material is employed, the light emitted from a portion of the light-emitting area just under the boding pad electrode is completely shaded. Thus, an orthogonal projection of a bonding pad (i.e., a portion of the n-contact electrode) on the interface between the p-contact electrode and the p-layer is removed from the current flow area. To attain this feature, a target area of the p-layer surface is modified to a high-resistance area. That is, the target area of the p-layer surface is a face which is not in ohmic contact with the p-contact electrode, or a very high-resistance face. Through employment of this approach, the current flow from the p-contact electrode reaches vertically from the low-resistance face of the p-layer to the light-emitting layer, while the portion of the light-emitting layer corresponding to the high-resistance face of the p-layer serves as a non-light-emitting area. Thus, only an area of the light-emitting layer contributing to light extraction can be employed virtually as a light-emitting area, and the adverse effect of the large-area portion of the n-contact electrode serving as a bonding pad on interception of light extraction can be suppressed (first aspect).

For a similar reason, an area of the light-emitting layer corresponding to the entire wiring trace portion which extends from the large-area portion, or an area there of corresponding to at least a circular outer wiring trace portion, is preferably modified to a non-light-emitting area (third and fifth aspects).

Preferably, the non-light-emitting area is wider than the orthogonal projection of the n-contact electrode in the plan view. The increase in width of the non-light-emitting layer falls within a range of layer t/2 to 5t, where the thickness of the n-layer is t (second, fourth and sixth aspects).

This range is derived on the basis of the following.

In the light-emitting layer, a light-emitting area actually contributing to light emission corresponds to a low-resistance face of the p-layer, while a non-light-emitting area corresponds to a high-resistance face of the p-layer. In a cross-section vertical to the substrate of the light-emitting device, a line segment connecting the interface between the light-emitting area and the non-light-emitting area and the contour of the n-contact electrode is drawn. The angle $\theta$ is formed by the line segment and the line normal to the substrate surface. When the width of the high-resistance face of the p-layer is increased by d in one direction with respect to the orthogonal projection of the n-contact electrode on the p-layer, $\tan \theta$ is expressed by d/t.

The minimum value of d should be predetermined such that the range of the angle where light is shaded by the n-contact electrode does not become excessively large. When d equals t/2, $\theta$ is about 26.6° from the relation $\tan \theta = d/t = 1/2$. That is, portions of the light emitted from the edge of the light-emitting area having an emission angle greater than about 26.6° (0°: upwardly vertical to the substrate surface) are shaded by the n-contact electrode. If $\theta$ is smaller than 26.6°, the shielded angle range is wider and the light extraction efficiency decreases. Meanwhile, in the formation of the n-contact electrode, the n-contact electrode must be positioned to the p-contact electrode. The p-contact electrode is visually confirmed through the epitaxial layer, positioning should be performed with high precision. In order not to form an n-contact electrode on the light-emitting area, the minimum value of the thickness d is appropriately selected in accordance with the thickness of the epitaxial layer. The thickness of the epitaxial layer can be mainly determined by the thickness t of the n-layer. Thus, the inventors performed positioning while the thickness of the n-layer was varied. As a result, when the value of d is adjusted to satisfy the relation $d \geq t/2$, formation of the n-contact electrode on the light-emitting area can be surely prevented.

In contrast, when d is increased excessively, current laterally flowing in the n-layer increases, causing voltage drop due to sheet resistance of the n-layer. As a result, operation voltage is unavoidably increased. When the maximum value of d is adjusted to 5t, the increase in operation voltage can be suppressed to less than 0.1 V. When d is excessively large, the emission area becomes narrow, which is not advantageous.

The effects of the seventh to twenty-third aspects will be described as follows. In the case where the entirety of the bonding pad is brought into ohmic contact with the p-layer, even when no light-emitting area is present just under the large-area portion serving as a bonding pad, current flows from the bonding pad to the n-layer, and the current laterally flows in the n-layer and flows concentratedly into an edge of a light-emitting area in the vicinity thereof. However, through provision of the bonding pad with an area which is not in ohmic contact with the n-layer, the current supplied to the light-emitting device can be selectively distributed to the entire light-emitting area (seventh aspect).

In a preferred embodiment, the area which is not in ohmic contact with the n-layer is formed from an insulating layer, and the large-area portion of the n-contact electrode is formed such that the n-contact electrode stretches over the insulating layer and the portion of the n-layer to be in ohmic contact. The reason for forming the large-area portion such that the portion stretches over the two portions is to prevent disconnection between the large-area portion serving as a bonding pad and the wiring trace portion extending therefrom. When the wiring trace portion is formed such that the portion stretches over the insulating layer and the portion of the n-layer to be in ohmic contact, breakage of a wiring trace readily occurs due to steps present in the edges of the insulating layer. However, when the large-area portion is formed such that the portion stretches over the insulating layer and the n-layer, there are no steps between the large-area portion of the n-contact electrode formed on the n-layer and the wiring trace portion extending therefrom. Therefore, possible breakage can be prevented (eighth aspect).

In Group III nitride-based compound semiconductor light-emitting devices, the outer side surfaces (cross-sections) of the epitaxial growth layer are generally protected with insulating film, in order to avoid undesirable electrical connection between the p-layer and the n-layer due to deposition of conductive material after or during production of the devices. Thus, in the formation of the protective film, the protective film is integrally formed to also cover the large-area portion of the n-contact electrode and the area which is prevented from being in ohmic contact with the n-layer, whereby the production process can be simplified (ninth aspect).

In the case of a light-emitting device of a quadrilateral shape, preferably, the epitaxial growth layer is formed into a quadrilateral shape, and the n-layer (top layer) is formed into a quadrilateral shape. In order to supply current uniformly in a quadrilateral area of the light-emitting layer, preferably, a smaller grid-like wiring trace portion (outer wiring trace portion) of the n-contact electrode is formed so as to fit the contour of the quadrilateral shape of the epitaxial growth layer (tenth aspect). In one preferred embodiment, when the light-emitting area has a square (1 mm×1 mm) shape, the outer wiring trace portion of the electrode wiring trace portion is formed into a square grid (0.5 to 0.95 mm×0.5 to 0.95 mm).

In the case where the outer wiring trace portion is not sufficient to attain uniform supply of current to a wide light-emitting area, preferably, an inner wiring trace portion is additionally formed such that the area of the p-layer surrounded by the outer wiring trace portion is divided, and the n-contact electrode is caused to extend to the inside of the area surrounded by the outer wiring trace portion (eleventh aspect). Preferably, the inner wiring trace portion is formed into a pattern; for example, a pattern dividing the quadrilateral area surrounded by the outer wiring trace portion to narrower areas; i.e., straight-line parallel to one side of the outer wiring trace portion or a grid-like pattern. When a grid-like inner wiring trace portion is formed, even in the case where a portion of the inner wiring trace portion is broken or disconnected, a plurality of current flow paths for recovering the breakage are ensured, whereby current flow recovering the breakage is ensured.

Ultimately, the inner wiring trace portion is thought to play only a role in supplying current to the n-layer. However, the outer wiring trace portion also distributes current to the inner wiring trace portion. Thus, since the current flowing the inner wiring trace portion is thought to be smaller, preferably, the width of the inner wiring trace portion is adjusted to be smaller than that of the outer wiring trace portion, whereby the effect of the inner wiring trace portion on interference of light extraction is reduced (twelfth aspect). For example, the width of the outer wiring trace portion is preferably adjusted to 1.2 to 1.8 times the width of the inner wiring trace portion.

Preferably, when segments of the wiring trace portion of the n-contact electrode are disposed so as to satisfy the relationship $10 \geq L/t \geq 80$, wherein L denotes the distance between any two adjacent parallel segments of wiring trace, and t denotes the thickness of the n-layer. When L/t is less than 10, inner wiring traces having a width of, for example, some μm to some tens μm are disposed in parallel at small intervals, thereby excessively increasing the overall effect of the n-contact electrode on interference of light extraction. When L/t is in excess of 80, current flow from the wiring traces of the n-contact electrode adjacent to each other to the center portion of the n-layer becomes insufficient. As a result, the light-emitting layer to cause favorable light emission includes a mal-emission area (thirteenth aspect). L/t is more preferably 20 to 60.

Preferably, the part of the large-area portion which is in ohmic contact with the n-layer is in the form of a belt or a bent belt having a specific width, wherein the width is equal to or more and twice or less the width of the outer wiring trace portion of the n-contact electrode. In the case where large-area portions serving a bonding pads are provided at two corners of a quadrilateral-plane-shape outer wiring trace portion, the periphery of each large-area portion serves as an extension of the outer wiring trace portion. Thus, similar to the outer wiring trace portion, the large-area portions preferably serve as a current-supply portion.

When the portion of each large-area portion which is in ohmic contact with the n-layer has a width smaller than that of the outer wiring trace portion, breakage between the large-area portion and the outer wiring trace portion may occur. When the width is adjusted to twice or more the width of the outer wiring trace portion, current selectively flows in the n-layer from the bonding pad and concentratedly flows into the edge of a light-emitting area in the vicinity thereof, which is not preferred (fourteenth aspect).

Preferably, the plane shape of the n-contact electrode is designed to be line-symmetric or point-symmetric so that two large-area portions of the n-contact electrode serving as bonding pads supply equivalent current (fifteenth and sixteenth aspects).

The present invention is particularly advantageous to a light-emitting device produced through a laser lift-off process (seventeenth to nineteenth aspects).

Group III nitride-based compound semiconductors have high refractive index. Thus, when the light extraction face is directly sealed with a resin having low refractive index, the critical angle of total light reflection at the interface of the light extraction face and the resin increases, reducing light extraction efficiency. Thus, between the Group III nitride-based compound semiconductor light extraction face and the sealing resin, there is formed a transparent dielectric layer having a refractive index falling within the range of the refractive index of the semiconductor and that of the sealing resin, to thereby enhance light extraction efficiency. Such a transparent dielectric layer may also serve as a protective layer for the exposed portion of the n-layer surface (twentieth aspect).

When the transparent dielectric layer is formed to cover the outer peripheral surface of the device, the formation encounters no difficulty. In addition, a wide adhesion interface between the dielectric layer and a layer thereunder can be provided, whereby unfavorable conditions such as peeling can be prevented. In the present invention, when the outer peripheral surface is covered with, for example, the protective film according to the ninth aspect, the dielectric layer is formed on the protective film. In this case, the upper layer and the lower layer (protective film) mutually compensate their functions, whereby the protection performance to the outer peripheral surface of the device can be enhanced (twenty-first aspect).

When the transparent dielectric layer is formed so as to cover the n-contact electrode, steps are formed to generate unnecessary internal stress, and cracks tend to generate. Thus, after formation of the transparent dielectric layer, a portion of the dielectric layer is removed through etching in order to provide a window slightly larger than the n-contact electrode, and an n-contact electrode slightly smaller than the area where no dielectric later is present is formed through a technique such as a lift-off process, whereby an exposed surface of the n-layer can be left between the transparent dielectric layer and the n-contact electrode. The thus-left exposed surface of the p-layer may be sealed with resin. Through the above procedure, crack generation, which would adversely affect device characteristics, can be prevented, when the step of forming a transparent dielectric layer is added to the production process (twenty-second aspect).

Preferably, the orthogonal projection of the transparent dielectric layer on the interface between the p-contact electrode and the p-layer completely covers the low-resistance face. Through this embodiment, at least light perpendicularly emitted from the light-emitting-area of the light-emitting layer can be perfectly introduced from the n-layer to the transparent dielectric layer (twenty-third aspect). Notably, the present invention does not excludes the case where a portion of the orthogonal projection of the transparent dielectric layer on the interface between the p-contact electrode and the p-layer enters a high-resistance face of the interface of the p-layer and the p-contact electrode.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
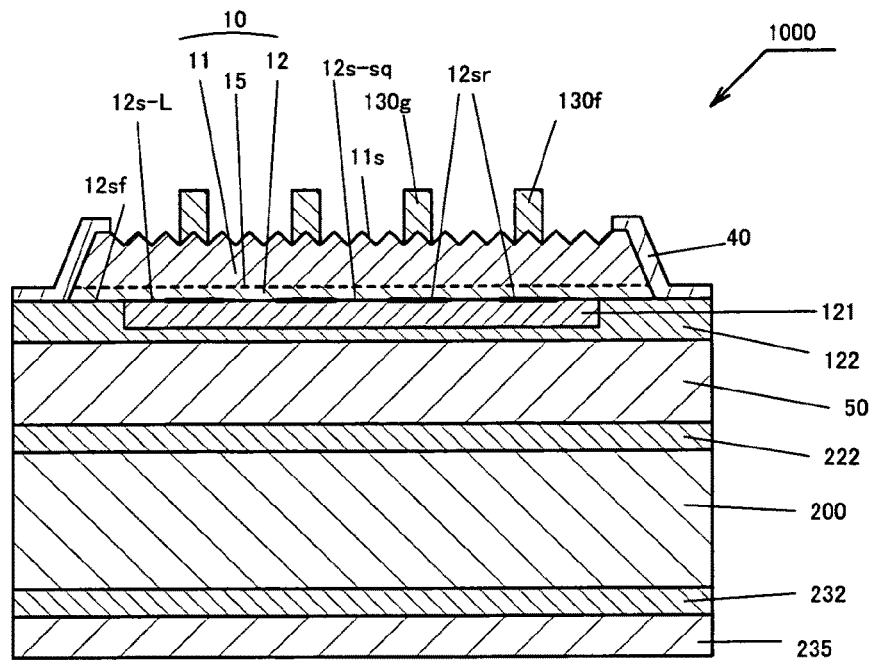
FIG. 1 is a cross-sectional view of the structure of a light-emitting diode 1000 according to one specific example of the present invention.

The present invention is applicable to a Group III nitride-based compound semiconductor light-emitting device produced through a laser lift-off process. Therefore, any known materials may be selected, and any known methods may be employed, so long as the laser lift-off technique is applicable.

The low-resistance face and the high-resistance face may be formed through surface modification of the p-layer. For example, the low-resistance face is a surface of the p-layer obtained through a customary process, and the high-resistance face is a face obtained by a particular process such as plasma treatment or ion implantation.

The n-contact electrode may be formed from a conductive material which has low contact resistance with an n-layer formed of a Group III nitride-based compound semiconductor. For example, a double-layer or a multiple layer containing an aluminum (Al) layer and a layer of a metal other than Al is preferably employed. In this case, instead of aluminum (Al), a portion of the n-contact electrode which is not to be in ohmic contact with the n-layer is covered only with a thick-film metal layer, which also covers the aluminum layer. The present invention encompasses this embodiment.

In the n-contact electrode, the plane shape and the area of the large-area portion serving as a bonding pad may be selected as desired. The shape may be selected from circle, ellipse, rectangle, or any other shape, and is for example, a square having a side of 80 μm or longer. In the case of a square large-area portion, the maximum side length thereof depends on the dimensions of a corresponding light-emitting device.

In the n-contact electrode, the wiring trace portion preferably has a width of 5 μm to 40 μm. When the width is less than 5 μm, difficulty is encountered in technically forming a line-shape n-contact electrode, and breakage of the electrode is more likely to occur after production, during use, etc. When the width is in excess of 40 μm, light extraction is excessively impeded. Needless to say, both cases are not preferred.

In the wiring trace portion, a frame-like outer wiring trace portion which is directly connected to the large-area portion serving as a bonding pad preferably has a width wider than that of the inner wiring trace portion. For example, the width of the outer wiring trace portion is adjusted to 1.2 to 1.8 times the width of inner wiring trace portion. The width of the outer wiring trace portion is preferably, for example, 8 μm to 40 μm, more preferably 10 μm to 30 μm. The width of the inner wiring trace portion is preferably 5 μm to 30 μm, more preferably 7 μm to 25 μm.

In the case where the wiring trace portion of the n-contact electrode is formed into a single group or double groups of parallel lines; e.g., in a frame-like square outer wiring trace portion, an inner wiring trace portion is formed as a plurality of line segments in the frame so that the square area is divided into rectangles or formed into a grid-like pattern, the distance L between two adjacent wiring traces disposed in parallel is preferably adjusted to 50 μm or longer. When the distance is less than 50 μm, a large number of wiring traces must be provided, and as a result, the wiring trace portion excessively impedes light extraction. The distance L between two adjacent wiring traces is preferably 70 μm to 500 μm, more preferably 100 μm to 300 μm.

No particular limitation is imposed on the method of forming the portion of the n-contact electrode which is not to be in ohmic contact with the n-layer. Examples of the method include the step of interposing an insulating film therebetween and the step of interposing a conductive layer formed of a metal having high contact resistance, a Schottky contact metal, etc. Alternatively, the aforementioned conductive material having low contact resistance to the p-layer (e.g., aluminum (Al)) may be partially employed to form an ohmic contact portion between the n-contact electrode and the n-layer. In this case, the portion of the n-layer which is not to be in ohmic contact with the n-contact electrode is not covered with a conductive material having low contact resistance. In a further alternative method, the portion of the n-layer which is not to be in ohmic contact with the n-contact electrode is selectively subjected to a particular treatment such as plasma treatment or ion implantation, to thereby remove the ohmic contact property with the n-contact electrode from the treated area.

The material of the transparent dielectric layer preferably has a refractive index of 1.45 to 2.4. For example, an inorganic oxide is preferred, since the dielectric layer is easily formed therefrom. Examples of the inorganic oxide include aluminum oxide ($Al_2O_3$), cerium oxide ($CeO_2$), hafnium oxide ($HfO_2$), magnesium oxide (MgO), niobium oxide ($Nb_2O_5$), silicon oxide ($SiO_2$), tantalum oxide ($Ta_2O_5$), yttrium oxide ($Y_2O_3$), and zirconium oxide ($ZrO_2$). Examples of other inorganic materials include inorganic nitrides such as silicon nitride ($Si_3N_4$) and inorganic oxynitrides such as silicon oxide nitride (SiON). The refractive index more preferably falls within a range of 1.6 to 2.2. In this regard, aluminum oxide ($Al_2O_3$), cerium oxide ($CeO_2$), hafnium oxide ($HfO_2$), magnesium oxide (MgO), niobium oxide ($Nb_2O_5$), tantalum oxide ($Ta_2O_5$), yttrium oxide ($Y_2O_3$), silicon nitride ($Si_3N_4$), and silicon oxide nitride (SiON) satisfy the requirement.

Preferably, the dielectric layer is formed at a position separate from the thick-film n-contact electrode and so as to cover the exposed surface of the n-layer and the outer peripheral surface of the device. The reason for taking a certain distance from the thick-film n-contact electrode is to prevent unnecessary crack generation due to formation of steps.

EXAMPLES

Example 1

Figure 2:
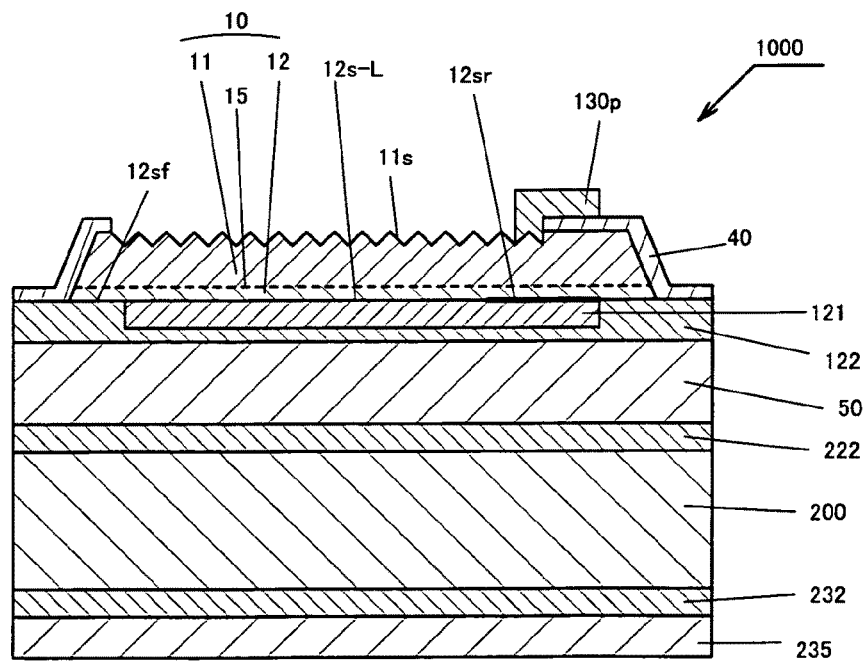
FIG. 2 is another cross-sectional view of the light-emitting diode 1000.
Figure 7:
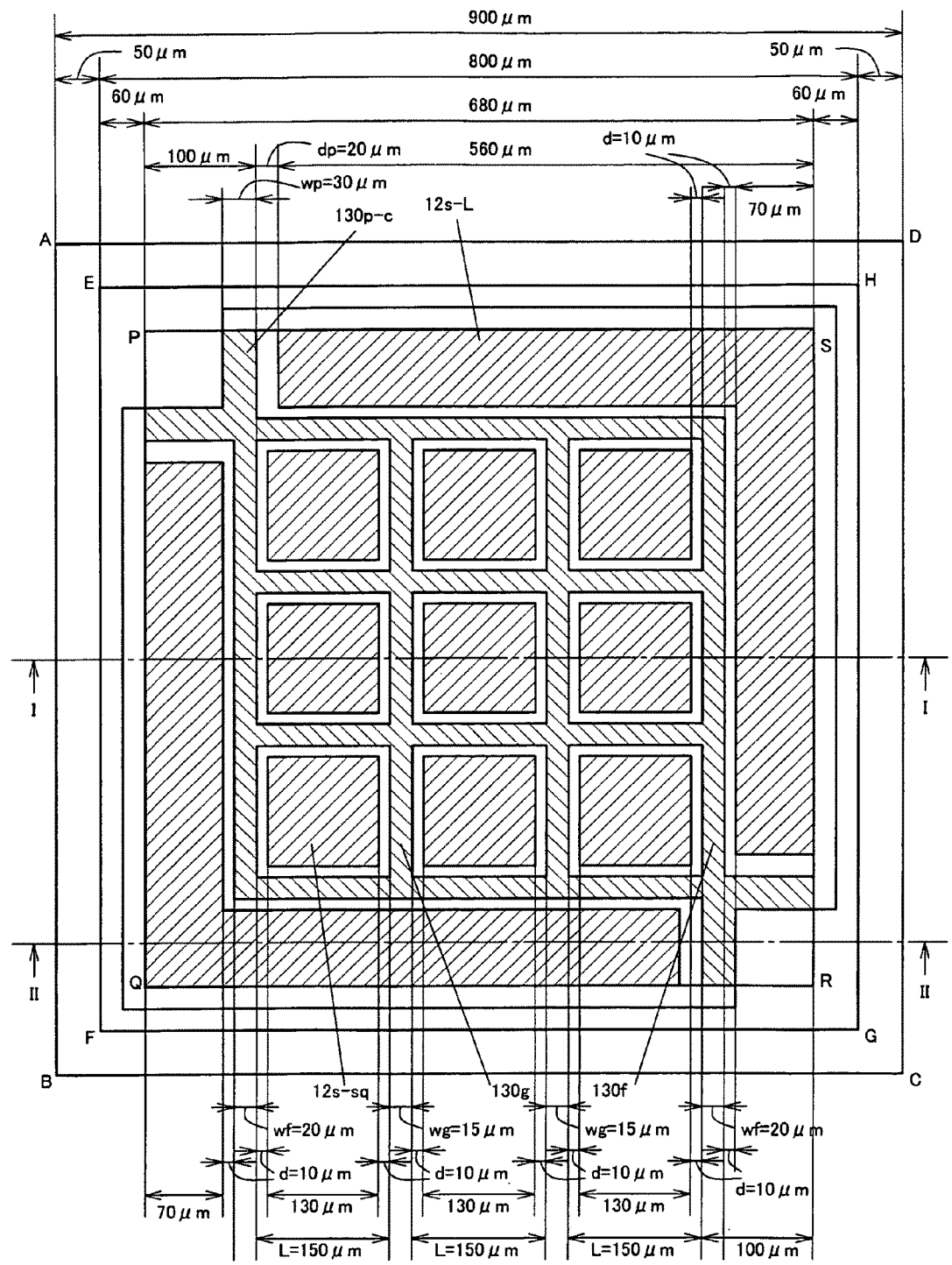
FIG. 7 is an overlapped plan view of the low-resistance face of the p-layer 12 shown in FIG. 5 and an ohmic contact area of the n-layer 11 shown in FIG. 6.

FIG. 1 is a cross-sectional view of the structure of a light-emitting diode (Group III nitride-based compound semiconductor light-emitting device) 1000 according to a specific example of the present invention, and FIG. 2 is another cross-sectional view of the light-emitting diode 1000. FIGS. 1 and 2 are cross-sectional views cut along line segments I-I and II-II, respectively, shown in FIG. 7 given hereinbelow.

The light-emitting diode 1000 shown in FIGS. 1 and 2 has a stacked structure having a p-type silicon substrate serving as a conductive support substrate 200 and, successively stacked on the support substrate 200, a conductive layer 222 formed of a plurality of stacked metal layers, a solder layer 50, a conductive layer 122 formed of a plurality of stacked metal layers, a p-contact electrode 121, a p-layer 12 formed mainly of a single layer or multiple layers of a p-type Group III nitride-based compound semiconductor, a light-emitting layer 15, an n-layer 11 formed mainly of a single layer or multiple layers of an n-type Group III nitride-based compound semiconductor, an outer wiring trace portion 130f serving as an n-contact electrode, an inner wiring trace portion 130g, and a large-area portion 130p.

The light-emitting layer 15 is formed of, for example, an MQW structure. However, the light-emitting layer 15 is represented by simply a thick dashed line in FIGS. 1 and 2.

The outer wiring trace portion 130f, the inner wiring trace portion 130g, and the large-area portion 130p, each serving as an n-contact electrode, are communicated with one another at certain positions (not illustrated) to form an integrated n-contact electrode. Through wire-bonding to the large-area portion 130p, the outer wiring trace portion 130f, the inner wiring trace portion 130g, and the large-area portion 130p are generally at the same electric potential. In FIG. 1, only the outer wiring trace portion 130f and inner wiring trace portion 130g are shown, and in FIG. 2 only the large-area portion 130p is shown.

The surface of the p-layer 12 which is in contact with the p-contact electrode 121 or the conductive layer 122 is divided into a high-resistance face 12sr, low-resistance faces 12s-sq and 12s-L, and an outer peripheral surface 12sf which is not in ohmic contact. In the outer peripheral surface 12sf, the p-contact electrode 121 is not present and the p-layer 12 is in direct contact with the conductive layer 122. The high-resistance face 12sr is represented by a thick line segment in FIGS. 1 to 4.

The high-resistance face 12sr of the p-layer 12 is formed through forming the p-layer 12 and subjecting the target area to ion implantation or plasma treatment. When laser lift-off is performed to form the light-emitting diode 1000, Group III nitride-based compound semiconductor layers are epitaxially grown on an epitaxial growth substrate, to thereby form the p-layer 12 serving as a top layer. The exposed surface of the p-layer 12 is partially subjected to ion implantation or plasma treatment. As a result, as shown in FIGS. 1 and 2, the high-resistance face 12sr can be formed at the contact interface between the p-layer 12 and the p-contact electrode 121.

The member described in the first aspect as "a layer formed of a conductive material" corresponds to the conductive layer 222, the solder layer 50, the conductive layer 122, and the p-contact electrode 121 in Example 1.

As is clear from FIGS. 1 and 2, the outer peripheral surfaces of the p-layer 12, the light-emitting layer 15, and the n-layer 11 are covered with an insulating protective film 40. The horizontal cross-section of an epitaxial layer 10 (including the p-layer 12, the light-emitting layer 15, and the n-layer 11) parallel to the surface of the support substrate 200 gradually decreases from the p-layer 12 (bottom side, support substrate 200 side) to the n-layer 11 (top side, n-contact electrode 130 side). Therefore, the outer peripheral surface of the epitaxial layer 10 covered with the insulating protective film 40 assumes a forwardly tapered surface inclined from the top side (n-contact electrode 130 side) to the bottom side (support substrate 200 side).

The n-layer 11 is provided with a surface 11s having microembossment in order to enhance light extraction efficiency.

On the back side of the support substrate 200, a conductive layer 232 formed of a plurality of metal layers and a solder layer 235 are formed.

In Example 1, these conductive layers have the following structures.

The conductive layer 222 formed of a plurality of metal layers is formed by successively stacking titanium (Ti), nickel (Ni), and gold (Au) on the support substrate 200. The conductive layer 232 formed of a plurality of metal layers is formed by successively stacking platinum (Pt), titanium (Ti), nickel (Ni), and gold (Au) on the support substrate 200. The nickel (Ni) layer is provided in order to prevent diffusion of tin (Sn) contained in the solder layer 50.

The solder layers 50 and 235 are formed from a gold-tin alloy (Au—Sn) solder. The surface of the solder layer 235 is covered with a gold (Au) thin layer in order to prevent oxidation of tin.

The p-contact electrode 121 is formed from a silver (Ag) alloy.

The conductive layer 122 formed of a plurality of metal layers is formed by successively stacking titanium (Ti), platinum (Pt), titanium (Ti), titanium nitride (TiN), and gold (Au) from the p-layer 12 and the p-contact electrode 121.

The n-contact electrode 130 has a stacked structure of aluminum (Al), titanium, (Ti), nickel (Ni), and gold (Au) from the n-layer 11 side.

The insulating protective film 40 is formed of silicon nitride ($Si_3N_4$).

The insulating protective film 40 corresponds to the insulating film and the protective film described in the aforementioned aspects of the invention.

Figure 3:
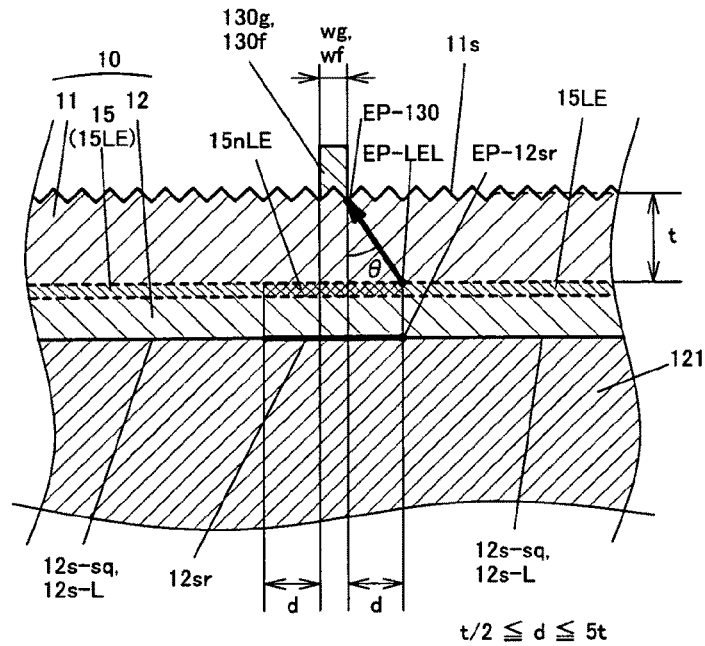
FIG. 3 is a partially enlarged cross-sectional view of the cross-sectional view of FIG. 1.

FIG. 3 is an enlarged cross-sectional view of the cross-sectional view of the light-emitting diode 1000 of FIG. 1, wherein a stacked structure from the outer wiring trace portion 130f or the inner wiring trace portion 130g of the n-contact electrode to the p-contact electrode 121 is enlarged.

The line-shape outer wiring trace portion 130f or inner wiring trace portion 130g is formed such that the longitudinal direction thereof is aligned normal to FIG. 3 as viewed from the sheet. The line-shape outer wiring trace portion 130f or inner wiring trace portion 130g has a line width (left to right in FIG. 3) of wf or wg. The p-contact electrode 121 under the wiring trace portion is not in ohmic contact with the p-layer 12, or has considerably high contact resistance, by virtue of the high-resistance face 12sr formed on the surface of the p-layer 12. The high-resistance face 12sr is a quadrilateral area which has a longitudinal direction corresponding to that of the line-shape outer wiring trace portion 130f or the inner wiring trace portion 130g and which has a width of (wf+2d) or (wg+2d).

Since the p-layer 12 has high resistance, when current flow is inhibited by the high-resistance face 12sr, the area having a width of (wf+2d) or (wg+2d) of the light-emitting layer 15 above the high-resistance face 12sr does not allow current to flow, whereby the area serves as a non-light-emitting area 15nLE. An area of the light-emitting layer 15 where current flow is not inhibited by the high-resistance face 12sr serves as a light-emitting area 15LE from which light is actually emitted.

In the cross-sectional view of FIG. 3, EP-12sr represents the right-end point of the high-resistance face 12sr; EP-LEL represents a boundary point between the non-light-emitting area 15nLE and the light-emitting area 15LE of the light-emitting layer 15; the EP-LEL is disposed right over the EP-12sr, i.e., the EP-LEL is light-emittable end point; and EP-130 represents the right-end point of the contact surface between a surface 11s of the n-layer 11 and the line-shape outer wiring trace portion 130f or inner wiring trace portion 130g.

The angle θ is defined as the angle formed by the line segment connecting the points EP-LEL and EP-130 and the line normal to the substrate surface in FIG. 3 (direction normal to the substrate surface of the light-emitting diode 1000), and the n-layer 11 having the micro-embossed surface 11s has a thickness t. Thus, tan θ=d/t (FIG. 3).

In consideration that the n-layer 11 has a thickness t of 2 μm to 10 μm, preferably 3 μm to 6 μm; that the line-shape outer wiring trace portion 130f has a lateral width wf of 8 μm to 40 μm; and that the inner wiring trace portion 130g has a lateral width wg of 5 μm to 30 μm, d is considered to be preferably t/2 to 5t. When the n-layer 11 has a thickness of 10 μm or less, the resistance of the layer increases as the current flow path increases. Accordingly, the current flow path whose minimum value is equal to d in the n-layer 11 of the thin film in the lateral direction should not be excessively long. In this regard, the optimum range of d is represented by the proportional relationship between d and t (film thickness).

The minimum value of d should be determined such that the width of the angle in which the light emitted from the end point EP-LEL of the light-emitting layer 15LE is shaded by the line-shape outer wiring trace portion 130f or inner wiring trace portion 130g does not become excessively large. When d is equal to t/2, A is about 26.6°, from the relation tan θ=d/t=1/2. That is, portions of the light emitted from the end point EP-LEL of the light-emitting layer 15LE having an emission angle greater than about 26.6° (0°: upwardly vertical to the substrate surface) are shaded by the line-shape outer wiring trace portion 130f or inner wiring trace portion 130g (i.e., the n-contact electrode). When the width of shaded angle is wide, the light extraction efficiency decreases. Meanwhile, in the formation of the n-contact electrode (130f or 130g), the n-contact electrode must be positioned to the p-contact electrode 121. The p-contact electrode 121 need to be visually confirmed through the epitaxial layer 10 and positioning should be performed with high precision. In order not to form an n-contact electrode (130f or 130g) on the light-emitting area 15LE, the thickness d has the minimum value in accordance with the thickness of the epitaxial layer 10. The thickness of the epitaxial layer 10 is almost determined by the thickness t of the n-layer 11. Thus, the inventors performed positioning while the thickness of the n-layer 11 was varied. As a result, when the d is adjusted to satisfy the relation d≧t/2, formation of the n-contact electrode (130f or 130g) on the light-emitting area 15LE can be surely prevented.

In contrast, when d is increased excessively, current laterally flowing in the n-layer 11 increases, causing voltage drop due to sheet resistance of the n-layer 11. As a result, operation voltage is unavoidably increased. When the maximum value of d is adjusted to 5t, the increase in operation voltage can be suppressed to less than 0.1 V. When d is excessively large, the light-emitting area 15LE becomes narrow, which is not advantageous.

Figure 4:
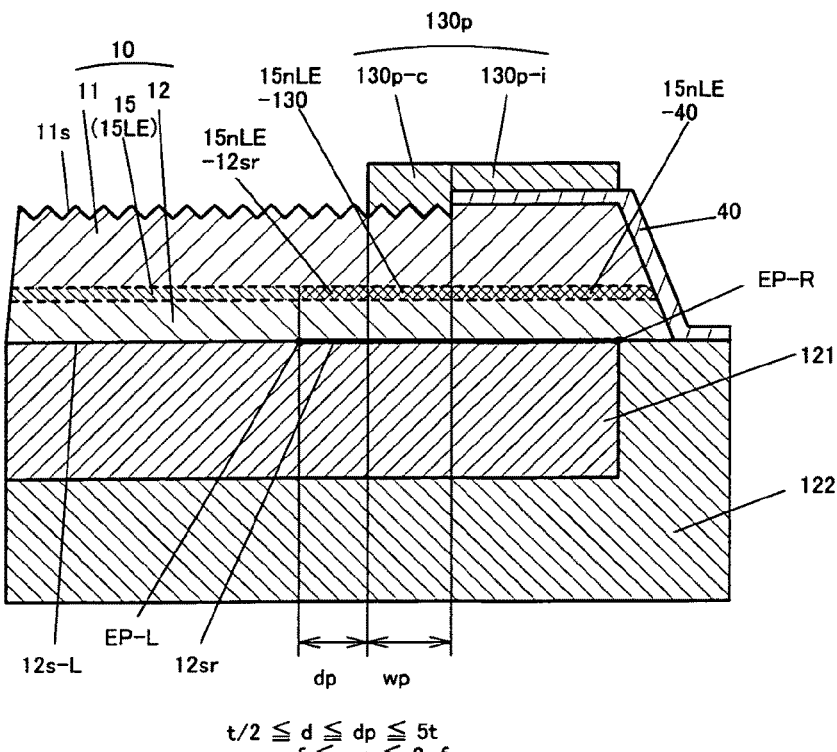
FIG. 4 is a partially enlarged cross-sectional view of the cross-sectional view of FIG. 2.

FIG. 4 is an enlarged cross-sectional view of the light-emitting diode 1000 of FIG. 2, wherein a stacked structure from the large-area portion 130p (serving as a bonding pad of the n-contact electrode for wire bonding) to the conductive layer 122 is enlarged.

Figure 6:
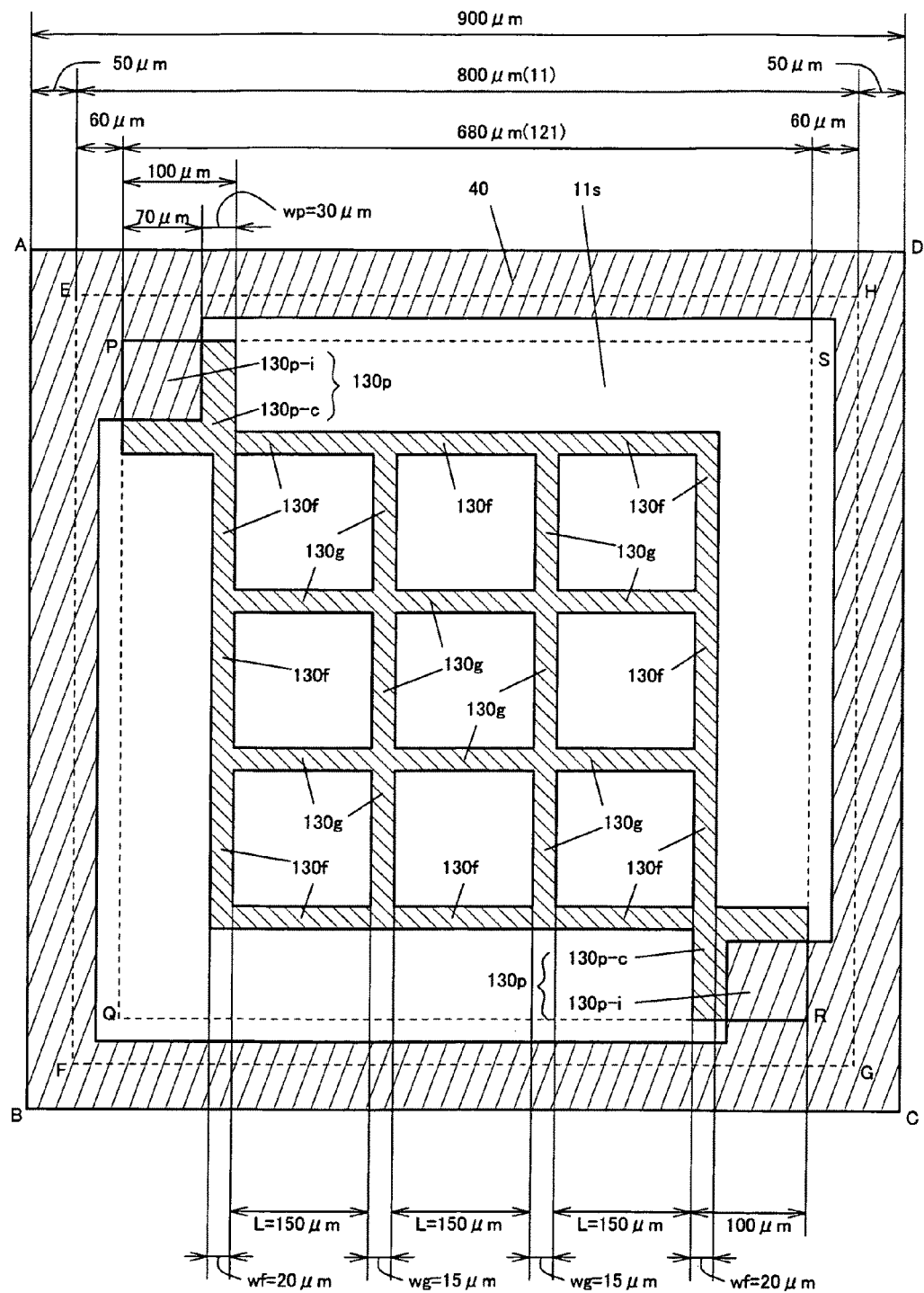
FIG. 6 is a plan view of an n-contact electrode of the light-emitting diode 1000 showing the arrangement of a large-area portion 130p, an outer wiring trace portion 130f, and an inner wiring trace portion 130g.

The large-area portion 130p of the n-contact electrode is formed so that the portion has a quadrilateral plane shape. A pair of sides are disposed in parallel with each other in the left-to-right direction in FIG. 4, and the other two sides are disposed in the direction normal to FIG. 4 as viewed from the sheet. The large-area portion 130p shown in FIG. 4 is connected to the line-shape outer wiring trace portion 130f shown in FIG. 3 at a certain position (not illustrated). The line-shape outer wiring trace portion 130f shown in FIG. 3 is connected to the line-shape inner wiring trace portion 130g shown in FIG. 3 at a certain position (not illustrated). That is, the large-area portion 130p shown in FIG. 4 forms an n-contact electrode to the n-layer 11 integrally with the line-shape outer wiring trace portion 130f and inner wiring trace portion 130g shown in FIG. 3. The structure of the n-contact electrode is shown in FIG. 6 given hereinbelow.

As shown in FIG. 4, the lower surface of the large-area portion 130p of the n-contact electrode is formed of a contact area 130p-c which is in contact with the micro-embossed surface 11s of the n-layer 11, and a non-contact area 130p-i under which an insulating protective film 40 is formed on the n-layer 11. The contact area 130p-c of the large-area portion 130p which area is in contact with the surface 11s of the n-layer 11 has a width of wp. The contact area 130p-c of the large-area portion 130p, which area is in contact with the surface 11s of the n-layer 11, assumes a belt-like area having a width of wp, and the longitudinal direction thereof is normal to FIG. 4 as viewed from the sheet.

The contact area 130p-c of the large-area portion 130p, which area is in contact with the surface 11s of the n-layer 11, is connected to the line-shape outer wiring trace portion 130f, which is in contact with the surface 11s of the n-layer 11 shown in FIG. 3 at a certain position (not illustrated). This feature is shown in FIG. 6 given hereinbelow. In order to prevent breakage of the connection part, the width wp of the contact area 130p-c of the large-area portion 130p must be adjusted to be wider than the width wf of the line-shape outer wiring trace portion 130f. The width wp of the contact area 130p-c of the large-area portion 130p corresponds to an area intercepting the light emitted from the light-emitting area 15LE.

Thus, as shown in FIG. 4, the high-resistance face 12sr of the p-layer 12 is formed at the interface between the p-layer 12 and the p-contact electrode 121 from the right-end point EP-R of the p-contact electrode 121 to the left-end point thereof EP-L. The high-resistance face 12sr is formed at the interface between the p-layer 12 and the p-contact electrode 121 in an area just under the large-area portion 130p and in an additional outer area extending from the above area by a width of dp. Since the current flow from the p-contact electrode 121 is shaded by the high-resistance face 12sr of the p-layer 12, current flows only in the upward direction from the low-resistance face 12s-L. Thus, in the light-emitting layer 15, the non-light-emitting area 15nLE is formed from the following emitting areas: an area 15nLE-40 just under the insulating protective film 40; an area 15nLE-130 facing the portion of the large-area portion 130p of the n-contact electrode, having a width of wp in contact with the surface 11s of the n-layer 11; and an area 15nLE-12sr having a width dp extending from the area 15nLE-130.

From the same reason as described in relation to the width (wf+2d) or (wg+2d) of the high-resistance face 12sr of the p-layer 12 facing the line-shaped outer wiring trace portion 130f or inner wiring trace portion 130g shown in FIG. 3, the maximum value of the width dp of the high-resistance face 12sr of the p-layer 12 shown in FIG. 4 must be 5t. "t" represents the average thickness of the n-layer 11. The minimum thickness of dp is adjusted to d. Through the adjustment, a portion of the large-area portion 130p of the n-contact electrode, which portion is in contact with the surface 11s of the n-layer 11, can perform the same function as that of the line-shaped outer wiring trace portion 130f or inner wiring trace portion 130g.

In FIG. 4, the maximum vale of width wp of the contact area 130p-c, which is a portion of the large-area portion 130p being in contact with the surface 11s of the n-layer 11, may be preferably the value twice the width wf of the line-shape outer wiring trace portion 130f connected thereto. This condition is necessary to prevent from concentrating the current flow into the portion of the light-emitting area corresponding to the vicinity of the contact area 130p-c.

Figure 5:
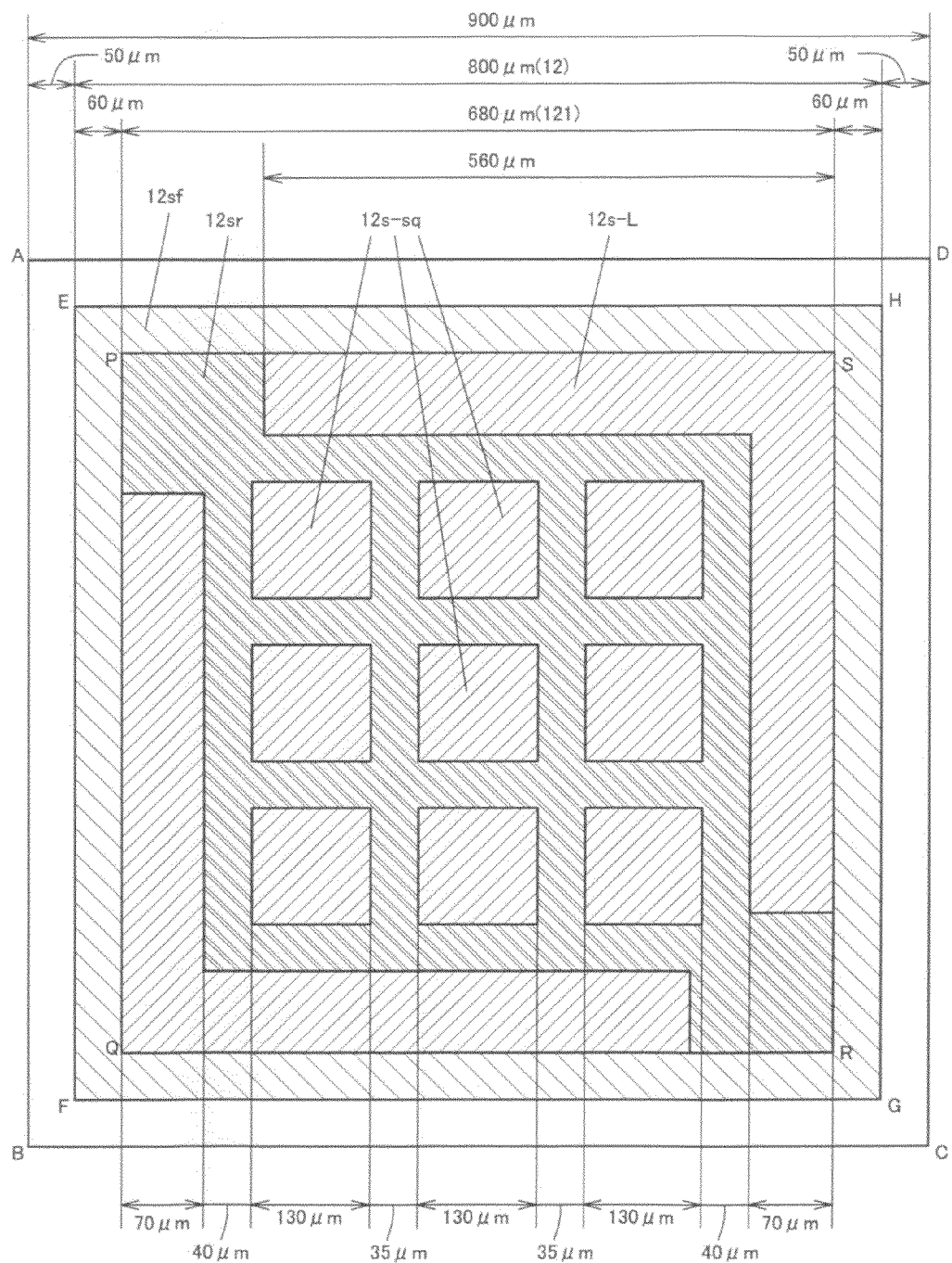
FIG. 5 is a plan view of the p-layer 12 of the light-emitting diode 1000 showing the arrangement of a high-resistance face, a low-resistance face, and an outer peripheral surface.

The features of Example 1 have been described hereinabove with reference to the related cross-sectional views. Example 1 will further be described with reference to plan views of FIGS. 5 to 7. FIG. 5 is a plan view of a p-layer 12 of the light-emitting diode 1000 acording to Example 1 on the side of a p-contact electrode 121, showing the arrangement of a high-resistance face 12sr, low-resistance faces 12s-sq and 12s-L, and a outer peripheral surface 12sf which is not in ohmic contact with the p-contact electrode 121. In FIG. 5, a square ABCD (900 μm×900 μm) represents the contour of the light-emitting diode 1000. In FIG. 5, a square EFGH (800 μm×800 μm) represents the contour of the p-layer 12 of the light-emitting diode 1000. In FIG. 5, a square PQRS (680 μm×680 μm) represents the contour of the p-contact electrode 121. In FIG. 5, the six points A, E, P, R, G, and C align in a line, and the six points B, F, Q, S, H, and D also align in a line. This feature is the same as in FIGS. 6 and 7. Each of the plan views of FIGS. 5 to 7 has line symmetry with respect to line AC and also with respect to line BD. In addition, each of the plan views of FIGS. 5 to 7 has point symmetry with respect to the point of intersection between lines AC and BD.

In FIG. 5, the p-layer 12 is an inner area of the square EFGH and is divided into four parts. Firstly, there is an outer peripheral surface 12sf, which is an area not in contact with the p-contact electrode 121 represented by an inner area of the square PQRS. The outer peripheral surface 12sf is present inside of the square EFGH and outside the square PQRS, and assumes a frame-like area having a width of 60 μm.

Secondly, in the area of the p-layer 12 which is in contact with the p-contact electrode 121, two low-resistance faces 12s-L have dimensional features as follows. Each low-resistance face 12s-L is formed from two quadrilateral pieces (560 Rm×70 μm) by overlapping square end portions (70 μm×70 μm) so as to form an L-shape. The two low-resistance faces 12s-L are present inside the square PQRS, one being an area with an outer corner point Q, and the other being an area with an outer corner point S.

In the area of the p-layer 12 which is in contact with the p-contact electrode 121, nine low-resistance faces 12s-sq have dimensional features as follows. Each of them is a square area (130 μm×130 μm), and two adjacent faces are located at a distance of 35 μm. All the nine low-resistance faces 12s-sq are placed in a square area having one side of 460 μm (130×3+35×2). As mentioned above, the nine low-resistance faces 12s-sq are arranged such that each of them has line symmetry with respect to line AC, and line symmetry with respect to line BD as shown in FIG. 5.

Thus, the remaining of the inner area of the square PQRS forms a high-resistance face 12sr. The high-resistance face 12sr consists of two generally square areas having a corner point of P and R and eight belt-like areas (40 μm×35 μm), in an overlapping mode.

Current flows from the p-contact electrode 121 to the p-layer 12 through the low-resistance faces 12s-L and low-resistance faces 12s-sq (hatched from the upper right corner to the lower left corner in FIG. 5). Since the p-layer 12 has high resistance and a thickness of 500 nm or less, current flow in the stacked structure from the p-layer 12 to the light-emitting layer 15 can be considered to occur vertically from the substrate surface; i.e., occur only in the vertical direction in each cross-section shown in FIGS. 1 to 4. Therefore, in the light-emitting layer 15, the actually light-emitting area 15LE can be thought to coincide with the area including the low-resistance faces 12s-L and low-resistance faces 12s-sq (hatched from the upper right corner to the lower left corner in FIG. 5).

FIG. 6 is a plan view of the light-emitting diode 1000 according to Example 1, showing the arrangement of the surface 11s of the n-layer 11, the insulating protective film 40, the n-contact electrode formed from the large-area portion 130p, the outer wiring trace portion 130f, and the inner wiring trace portion 130g. In FIG. 6, in the large-area portion 130p forming the n-contact electrode, the portion in ohmic contact with the n-layer 11 (contact area 130p-c), the outer wiring trace portion 130f, and the inner wiring trace portion 130g are hatched from the left upper corner to the lower right corner of FIG. 6. The area where the insulating protective film 40 is formed is hatched from the upper right corner to the lower left corner with an hatch angle of 75°.

In FIG. 6, the square EFGH represents the contour of the n-layer 11 of the light-emitting diode 1000 and has a side of 800 μm. As shown in FIGS. 1 and 2, the light-emitting diode 1000 has a forwardly tapered epitaxial layer 10. However, in the plan views of FIGS. 5 to 7, the taper is ignored, and the contour of the n-layer 11 is assumed to coincide with that of the p-layer 12. In an actual situation, when the epitaxial layer has a total thickness of 2 to 10 μm and a taper angle of 75° with respect to the normal direction) (90°), the contour of the uppermost surface of the n-layer 11 and the contour of the lowermost surface of the p-layer 12 are shown in FIG. 6 in the following mode. Specifically, when the lowermost surface of the p-layer 12 assumes the square EFGH (800 μm×800 μm), correctly, the uppermost surface of the n-layer 11 assumes a smaller square separate from the square EFGH (800 μm×800 μm) at a distance of 0.53 to 2.8 μm. No detailed description will be given on the width of the insulating protective film 40, since a portion other than the layer under the large-area portion 130p forming the n-contact electrode may be arbitrarily designed.

Two large-area portions 130p are provided to form the n-contact electrode. Each large-area portion assumes a square (100 μm×100 μm) and is disposed inside a square PQRS (680 μm×680 μm) such that the corner point P or R is shared by the square PQRS. In each large-area portion 130p forming n-contact electrode, there is provided a non-contact area 130p-i which is a square area (70 μm×70 μm) and under which the insulating protective film 40 is formed. The non-contact area 130p-i is disposed inside a square PQRS such that the corner point P or R is shared by the large area portion. The area of the large-area portion 130p except for the non-contact area 130p-i is a contact area 130p-c, which is an L-shape area having a width wp of 30 μm and being in ohmic contact with the surface 11s of the n-layer 11.

The outer wiring trace portion 130f forming the n-contact electrode is a square-frame-like area having a width wf of 20 μm. The outer side of the square has a length of 520 μm, and the inner side thereof 480 μm. Two corner portions of the square each having a side length of 20 μm overlap the large-area portions 130p forming the n-contact electrode, respectively.

The inner wiring trace portion 130g consists of four belt-like portions each having a width wg of 15 μm, and divides the inner area surrounded by the square-frame-like outer wiring trace portion 130f into nine areas. Each of the nine areas surrounded by the outer wiring trace portion 130f and the inner wiring trace portion 130g assumes a square (150 μm×150 μm).

In FIG. 6, the non-hatched area represents the exposed surface 11s of the n-layer 11. In Example 1, as shown in FIG. 6, the n-contact electrode to the n-layer 11 is not provided outside the square PQRS representing the area in which the p-contact electrode 121 is formed. However, the present invention is not limited to the structure. Needless to say, in the plan view, the n-contact electrode may cover an area wider than the area of the p-contact electrode 121 formed thereunder.

FIG. 7 is an overlapped plan view showing the area including the low-resistance faces 12s-L and low-resistance faces 12s-sq (hatched from the upper right corner to the lower left corner in FIG. 5), and the portion of the large-area portion 130p in ohmic contact with the n-layer 11 (contact area 130p-c), the outer wiring trace portion 130f, and the inner wiring trace portion 130g (hatched from the left upper corner to the lower right corner of FIG. 6). The outer wiring trace portion 130f and inner wiring trace portion 130g are separated from the low-resistance face 12s-L and low-resistance face 12s-sq by the presence of a belt-like or square-frame-like space having a width d of 10 μm, as shown in the plan view. In the plan view, the contact area 130p-c of the large-area portion 130p is separated from the low-resistance face 12s-L by a belt-like space having a width dp of 20 μm. The cross-sectional view of FIG. 7 cut along line segment I-I corresponds to FIG. 1, and the cross-sectional view of FIG. 7 cut along line segment II-II corresponds to FIG. 2.

The numerical values shown in FIG. 7 will be described in connection with the numerical limitations described in the aforementioned aspects of the invention. The inner wiring trace portion 130g has a width wg of 15 μm, which is smaller than the width wf of 20 μm of the outer wiring trace portion 130f. The segment of the outer wiring trace portion 130f and that of the inner wiring trace portion 130g which are adjacent to and in parallel to each other are separated from each other by a distance L of 150 μm. When the n-layer 11 has a thickness t of 2 μm, L/t is 75, whereas when the thickness t is 10 μm, L/t is 15. The contact area 130p-c of the large-area portion 130p is an L-shape area having a width wp of 30 μm. This width is is equal to or greater than the width wf of the outer wiring trace portion 130f (20 μm) and equal to or narrower than 2 wf.

Example 2

In Example 1, as shown in FIG. 5, the low-resistance face is divided by four belt-like areas of the high resistance face 12sr each having a width of 35 μm into nine low-resistance faces 12s-sq. The four belt-like areas of the high-resistance face 12sr each having a width of 35 μm may be replaced by low-resistance areas. Example 2 shows this feature.

Figure 8:
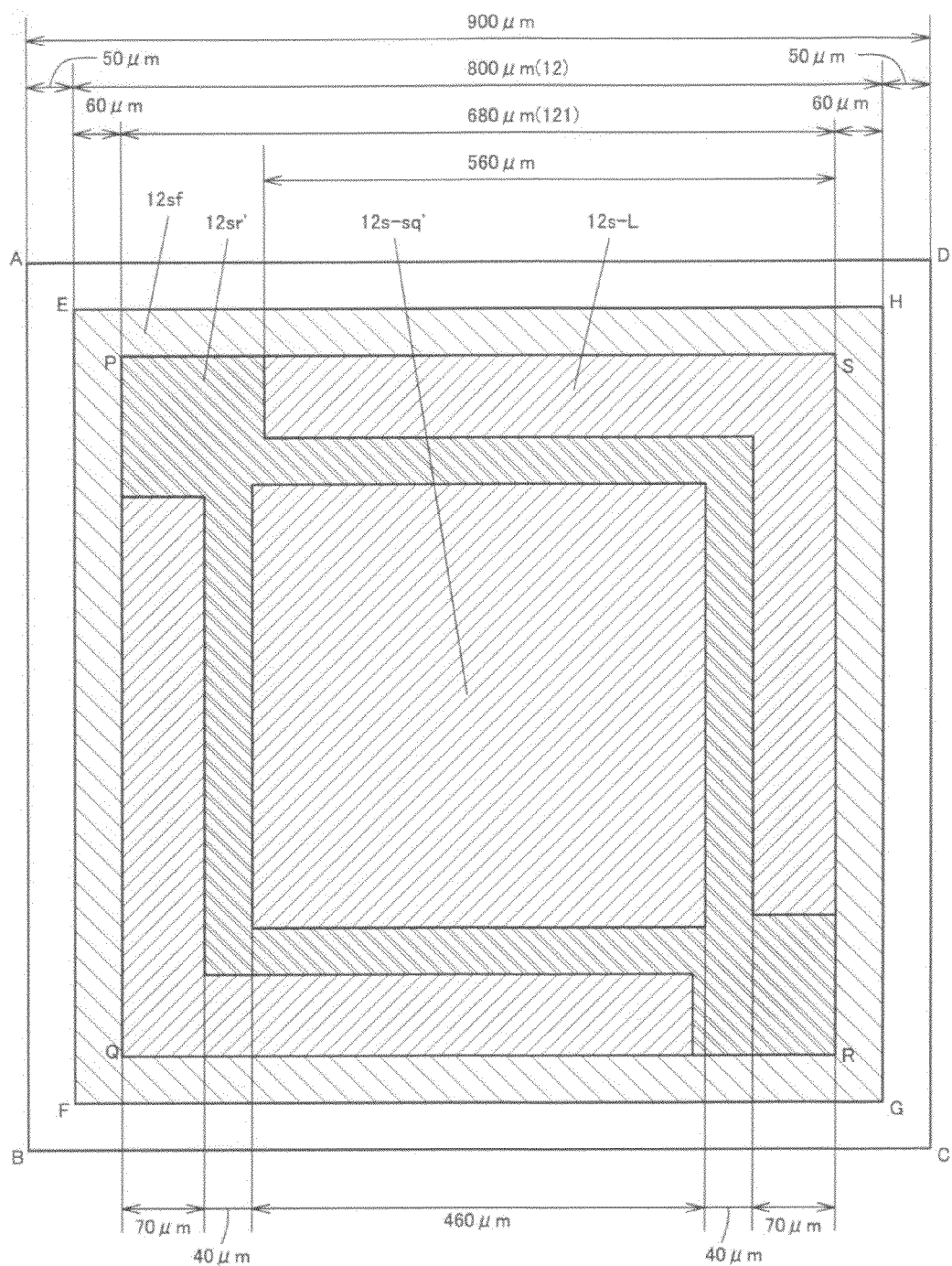
FIG. 8 is a plan view of a p-layer 12 of a light-emitting diode 2000 according to another specific example of the present invention, showing the arrangement of a high-resistance face, a low-resistance face, and an outer peripheral surface.

FIG. 8 is a plan view of a light-emitting diode 2000 according to Example 2, showing the arrangement, on the side of a p-layer 12, with which a p-contact electrode 121 is contacted, of a high-resistance face 12sr', low-resistance faces 12s-sq' and 12s-L, and an outer peripheral surface 12sf which is not in ohmic contact with the p-contact electrode 121. The configuration shown in FIG. 8 differs from that in FIG. 5 in that the low-resistance face 12s-sq' is a single square area (460 μm×460 μm) and that there are no grid-like areas in the high-resistance face 12sr'. Other than the two features, the configuration shown in FIG. 8 is the same as that in FIG. 5. For example, the two plan views have line symmetry with respect to line segments AC and BD. In one embodiment, the low-resistance face 12s-sq' is separated from the low-resistance face 12s-L by the mediation of a belt-like area of the high-resistance face 12sr' having a width of 40 μm.

Figure 9:
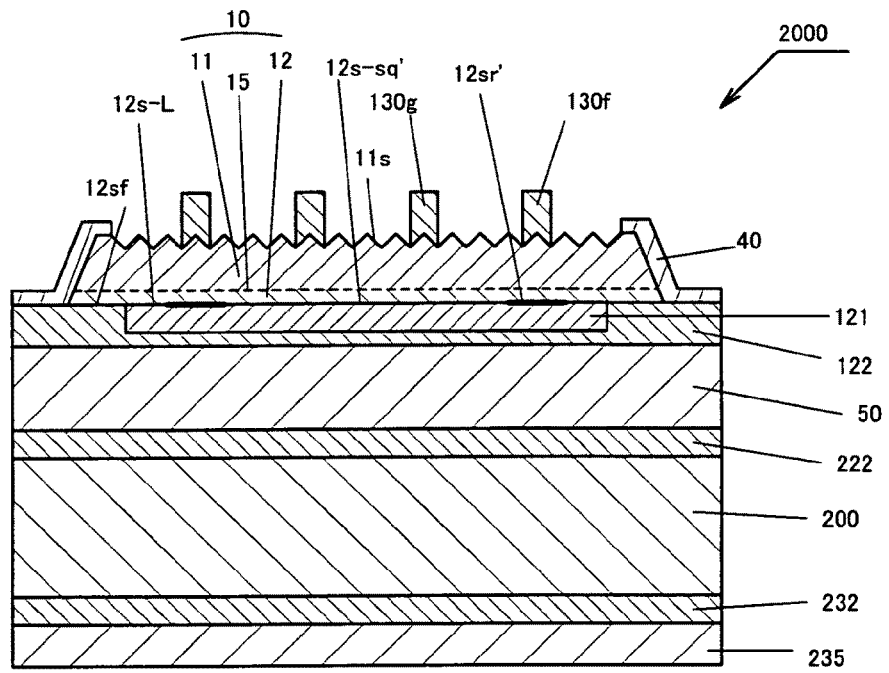
FIG. 9 is a cross-sectional view of the structure of the light-emitting diode 2000.
Figure 10:
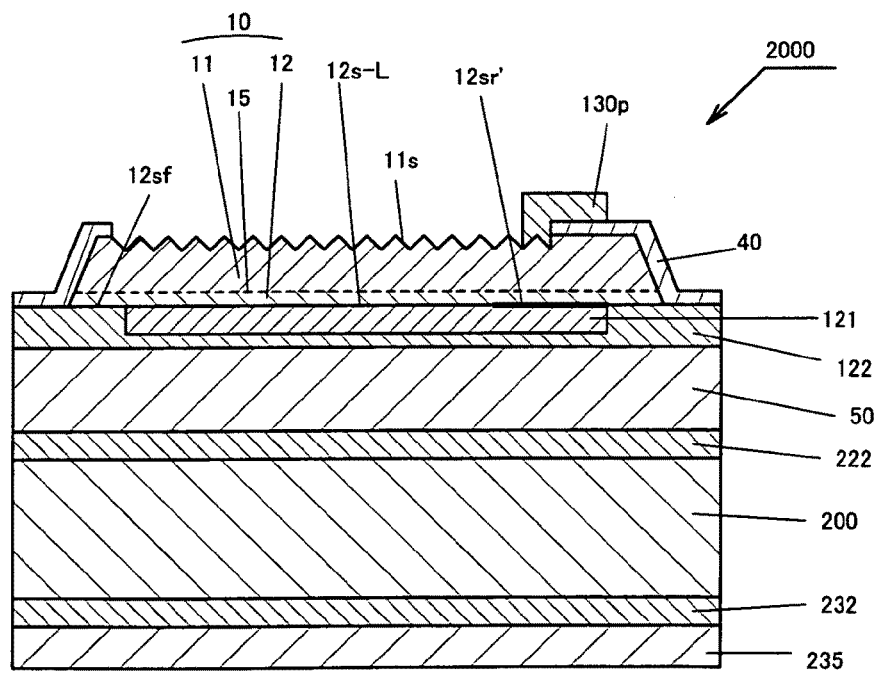
FIG. 10 is another cross-sectional view of the light-emitting diode 2000.

The cross-sectional views of the light-emitting diode 2000 according to Example 2 are shown in FIGS. 9 and 10. As shown in FIG. 9, the light-emitting diode 2000 according to Example 2 does not have a high-resistance face 12sr' of the p-layer 12 under the inner wiring trace portion 130g. Thus, this area assumes a single continuous low-resistance face 12s-sq'. The configuration shown in FIG. 10 is virtually the same as the configuration shown in FIG. 2. The light-emitting diode according to Example 2 effectively works when the inner wiring trace portion 130g has a width wg of 20 μm or less. Preferably, the inner wiring trace portion 130g has a width wg of 10 μm or less.

In Examples 1 and 2, in order to form a non-light-emitting area 15nLE in the light-emitting layer 15, a target area of the p-layer 12 which is in contact with the p-contact electrode 121 is transformed to a high-resistance face 12sr or 12sr'. However, before formation of the p-contact electrode 121 on the p-layer 12, an insulating film, a film made of a high-contact-resistance material, etc. may be formed on a target area of the p-layer 12. In this embodiment, the same effects as shown in Examples 1 and 2 can be attained.

Example 3

Figure 11:
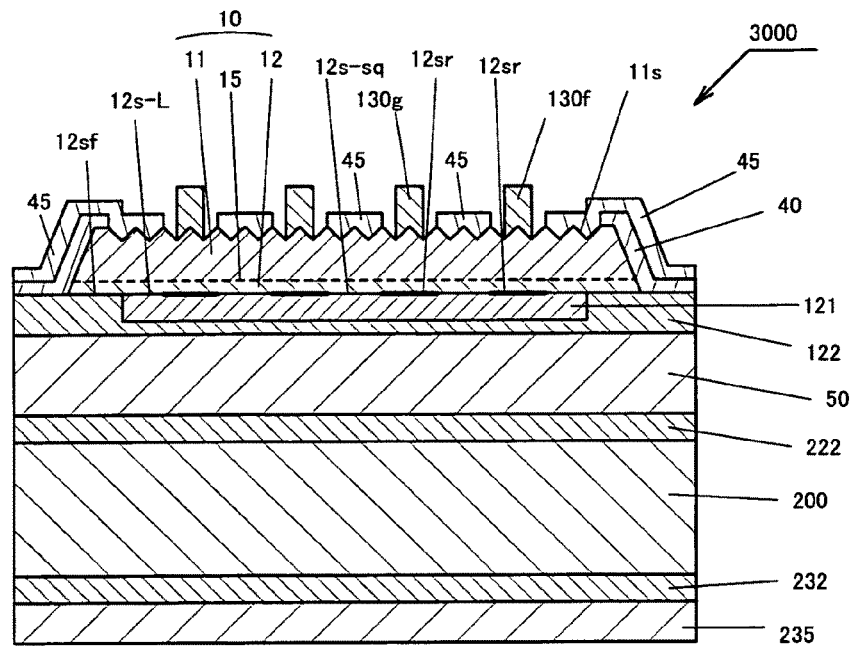
FIG. 11 is a cross-sectional view of the structure of the light-emitting diode 3000.
Figure 12:
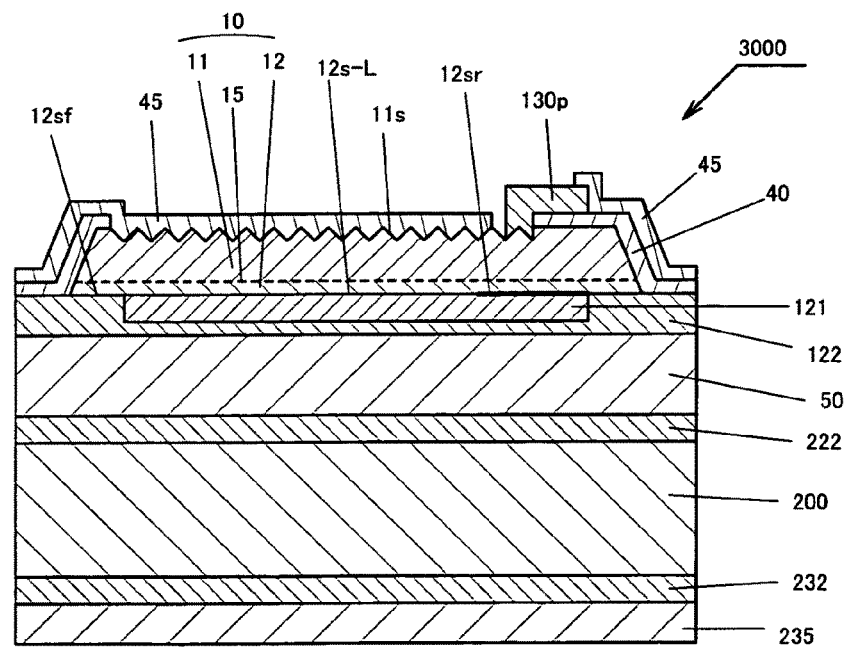
FIG. 12 is another cross-sectional view of the light-emitting diode 3000.

Example 3 is directed to a light-emitting device in which at least a portion of a micro-embossed surface 11s of an n-layer 11 is right over the low-resistance faces 12s-sq and 12s-L of the p-layer 12 is covered with a transparent dielectric layer. FIG. 11 is a cross-sectional view showing the configuration of a light-emitting diode 3000 according to Example 3. The light-emitting diode 3000 shown in FIG. 11 is based on the configuration of the light-emitting diode 1000 according to Example 1 shown in FIG. 1 to which a transparent dielectric layer 45 has been added. FIG. 12 is another cross-sectional view of the light-emitting diode 3000 according to Example 3, which is almost equivalent to the cross-sectional view of FIG. 2, as viewed from a position different from that of the light-emitting diode 1000 according to Example 1 shown in FIG. 1.

As shown in FIGS. 11 and 12, in the light-emitting diode 3000, at least a portion of the micro-embossed surface 11s of the n-layer 11 which exists right over the low-resistance faces 12s-sq and 12s-L of the p-layer 12 is covered with the transparent dielectric layer 45. Notably, as shown in FIGS. 11 and 12, the transparent dielectric layer 45 is provided so as to completely cover the whole area which exists right over the whole area of the low-resistance faces 12s-L and 12s-sq of the p-layer 12. In other words, the orthogonal projection of the transparent dielectric layer 45 on the interface between the p-layer 12 and the p-contact electrode 121 completely covers the whole area of the low-resistance faces 12s-L and 12s-sq of the p-layer 12. Meanwhile, preferably, the transparent dielectric layer 45 is formed so as to not cover an n-electrode 130 and an area of the surface 11s of the n-layer 11 which exists right over the high-resistance face 12sr of the p-layer 12. However, as shown in FIG. 12, a part of the area of the surface 11s of the n-layer 11, which area is right over the high-resistance face 12sr of the p-layer 12 or a portion of the surface of the large-area portion 130p of the n-electrode 130, may be covered with the transparent dielectric layer 45. That is, the present invention is not intended to exclude the case where an area which is right over the high-resistance face 12sr of the p-layer 12 is completely covered with the transparent dielectric layer 45. Also the transparent dielectric layer 45 may be formed so as to cover the outer side surface of the device. Or the transparent dielectric layer 45 may be formed so as to cover the insulating protective film 40 covering the outer side surface of the device.

The material of the transparent dielectric layer 45 preferably has a refractive index of 1.45 to 2.4, more preferably 1.6 to 2.2. Through controlling the refractive index, the light extraction of the device employing the material can be enhanced. Specific examples of the material include aluminum oxide ($Al_2O_3$), cerium oxide ($CeO_2$), hafnium oxide ($HfO_2$), magnesium oxide (MgO), niobium oxide ($Nb_2O_5$), silicon oxide ($SiO_2$), tantalum oxide ($Ta_2O_5$), yttrium oxide ($Y_2O_3$), zirconium oxide ($ZrO_2$), silicon nitride ($Si_3N_4$), and silicon oxide nitride (SiON). By virtue of the transparent dielectric layer 45, light extraction efficiency can be enhanced, and the outer peripheral surface of the device can be more effectively protected.

What is claimed is:

1. A Group III nitride-based compound semiconductor light-emitting device having an epitaxial layer joined on its p-layer side to a conductive support substrate via a layer formed of a conductive material, an n-layer disposed on a light extraction side, an n-contact electrode formed on the n-layer, and a p-contact electrode formed on the p-layer, wherein:
    the n-contact electrode comprises a large-area portion serving as a bonding pad, and a wiring trace portion extending from the large-area portion;
    the interface between the p-contact electrode and the p-layer includes a low-resistance face having low contact resistance with the p-contact electrode, and a high-resistance face having high contact resistance with the p-contact electrode; and
    the orthogonal projection of the large area potion of the n-contact electrode on the interface between the p-layer and the p-contact electrode does not fall in the low-resistance face.

2. A Group III nitride-based compound semiconductor light-emitting device according to claim 1, wherein the orthogonal projection of the large area potion of the n-contact electrode on the interface between the p-layer and the p-contact electrode has a contour which is separate from the contour of the low-resistance face by a distance falling within a range of t/2 to 5t, wherein t represents the average thickness of the n-layer.

3. A Group III nitride-based compound semiconductor light-emitting device according to claim 1, wherein the orthogonal projection of the wiring trace portion of the n-contact electrode on the interface between the p-layer and the p-contact electrode does not fall in the low-resistance face.

4. A Group III nitride-based compound semiconductor light-emitting device according to claim 3, wherein the orthogonal projection of the wiring trace portion of the n-contact electrode on the interface between the p-layer and the p-contact electrode has a contour which is separate from the contour of the low-resistance face by a distance falling within a range of t/2 to 5t, wherein t represents the average thickness of the n-layer.

5. A Group III nitride-based compound semiconductor light-emitting device according to claim 1, wherein the wiring trace portion of the n-contact electrode has a closed circular outer wiring trace portion, and the orthogonal projection of the outer wiring trace portion on the interface between the p-layer and the p-contact electrode does not fall in the low-resistance face.

6. A Group III nitride-based compound semiconductor light-emitting device according to claim 5, wherein the orthogonal projection of the outer wiring trace portion of the n-contact electrode on the interface between the p-layer and the p-contact electrode has a contour which is separate from the contour of the low-resistance face by a distance falling within a range of t/2 to 5t, wherein t represents the average thickness of the n-layer.

7. A Group III nitride-based compound semiconductor light-emitting device according to claim 1, wherein the n-layer has a quadrilateral plane shape, as viewed from the light extraction side, and has two large-area portions of the n-contact electrode provided thereon near two opposite angles of the quadrilateral shape, wherein at least a part of said two large-area portions facing the n-layer is not in ohmic contact with the n-layer.

8. A Group III nitride-based compound semiconductor light-emitting device according to claim 7, wherein the part of said two large-area portions which is not in ohmic contact with the n-layer is an area of the large-area portions under which an insulating film is formed, the insulating film intervening between said two large-area portions and the n-layer.

9. A Group III nitride-based compound semiconductor light-emitting device according to claim 8, wherein the insulating film is integrated with a protective film covering the outer side surfaces of the n-layer and the p-layer.

10. A Group III nitride-based compound semiconductor light-emitting device according to claim 7, wherein the wiring trace portion of the n-contact electrode has a quadrilateral-frame-shape outer wiring trace portion, and the outer wiring trace portion is connected, at two quadrilateral corners thereof, to said two large-area portions.

11. A Group III nitride-based compound semiconductor light-emitting device according to claim 10, wherein the wiring trace portion of the n-contact electrode has an inner wiring trace portion which is formed so as to divide the surface of the n-layer surrounded by the outer wiring trace portion.

12. A Group III nitride-based compound semiconductor light-emitting device according to claim 11, wherein, in the wiring trace portion of the n-contact electrode, the inner wiring trace portion has a width smaller than that of the outer wiring trace portion.

13. A Group III nitride-based compound semiconductor light-emitting device according to claim 10, wherein, when segments of the wiring trace portion of the n-contact electrode are disposed so as to satisfy the relationship $10 \leq L/t \leq 80$, wherein L denotes the distance between any two adjacent parallel segments of wiring trace, and t denotes the thickness of the n-layer.

14. A Group III nitride-based compound semiconductor light-emitting device according to claim 10, wherein the part of the large-area portion which is in ohmic contact with the n-layer is in the form of a belt or a bent belt having a specific width, wherein the width is equal to or more and twice or less the width of the outer wiring trace portion of the n-contact electrode.

15. A Group III nitride-based compound semiconductor light-emitting device according to claim 10, wherein the quadrilateral shape of the outer wiring trace portion is a parallelogram, rhombus, rectangle, or square.

16. A Group III nitride-based compound semiconductor light-emitting device according to claim 7, wherein the plane shape of the n-contact electrode is point-symmetric with respect to the centroid of the plane shape of the n-layer, or line-symmetric with respect to a line segment connecting two corners of the quadrilateral n-layer where two large-area portions are not provided.

17. A Group III nitride-based compound semiconductor light-emitting device according to claim 7, wherein the layer formed of a conductive material provided between the conductive support substrate and the p-layer includes at least one solder layer.

18. A Group III nitride-based compound semiconductor light-emitting device according to claim 17, which is produced by forming at least an n-layer on an epitaxial growth substrate made of a hetero substrate, subsequently forming a p-layer, joining the p-layer to a conductive support substrate via at least a solder layer, and removing the epitaxial growth substrate through a laser lift-off process.

19. A Group III nitride-based compound semiconductor light-emitting device according to claim 17, wherein the outer side surfaces of the n-layer and the p-layer assume the form of inclined planes tapered forward from the n-layer side serving as an light extraction side to the p-layer side.

20. A Group III nitride-based compound semiconductor light-emitting device according to claim 1, wherein the transparent dielectric layer is formed on at least a part of the exposed surface of the n-layer.

21. A Group III nitride-based compound semiconductor light-emitting device according to claim 20, wherein the transparent dielectric layer is formed so as to cover the outer side surface of the device.

22. A Group III nitride-based compound semiconductor light-emitting device according to claim 20, wherein the transparent dielectric layer is formed so as not to come into contact with the n-contact electrode.

23. A Group III nitride-based compound semiconductor light-emitting device according to claim 20, wherein the orthogonal projection of the transparent dielectric layer on the interface between the p-contact electrode and the p-layer completely covers a whole area of the low-resistance face.

* * * * *